US007807019B2

United States Patent
Ishii (10) Patent No.: US 7,807,019 B2
(45) Date of Patent: *Oct. 5, 2010

(54) RADIAL ANTENNA AND PLASMA PROCESSING APPARATUS COMPRISING THE SAME

(75) Inventor: Nobuo Ishii, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1646 days.

This patent is subject to a terminal disclaimer.

(21) Appl. No.: 10/343,201

(22) PCT Filed: Aug. 2, 2001

(86) PCT No.: PCT/JP01/06658

§ 371 (c)(1),
(2), (4) Date: Jun. 17, 2003

(87) PCT Pub. No.: WO02/13249

PCT Pub. Date: Feb. 14, 2002

(65) Prior Publication Data

US 2004/0027302 A1 Feb. 12, 2004

(30) Foreign Application Priority Data

Aug. 2, 2000 (JP) .............................. 2000-234497

(51) Int. Cl.
C23C 16/00 (2006.01)
H01L 21/306 (2006.01)
(52) U.S. Cl. ........................ 156/345.41; 118/723 MW
(58) Field of Classification Search .......... 118/723 ME, 118/723 MW, 723 MA, 723 MR, 723 AN; 156/345.41, 345.42
See application file for complete search history.

(56) References Cited

U.S. PATENT DOCUMENTS

| 5,433,789 A | * | 7/1995 | Kakehi et al. | ....... | 118/723 MW |
| 6,470,824 B2 | * | 10/2002 | Kawakami et al. | .... | 118/723 AN |
| 2001/0008122 A1 | * | 7/2001 | Goto et al. | ............ | 118/723 AN |

FOREIGN PATENT DOCUMENTS

| EP | 0674334 1 | 9/1995 |
| JP | 63-293824 A | 11/1988 |
| JP | 05-198388 A | 8/1993 |
| JP | 7-263187 A | 10/1995 |
| JP | 09-007998 A | 1/1997 |
| JP | 11-045799 A | 2/1999 |

OTHER PUBLICATIONS

Mar. 2, 2006, Supplemental European Search Report.

* cited by examiner

*Primary Examiner*—Luz L. Alejandro
(74) *Attorney, Agent, or Firm*—Crowell & Moring LLP (57) ABSTRACT

Guide members (37) extending from the microwave entrance to a ring member (34) are arranged in the direction of propagation of microwave in a radial waveguide. The guide members (37) contribute to prevention of complex electromagnetic mode due to a microwave reflected from the peripheral portion of the radial waveguide. Therefore, a uniform plasma can be produced because the radiation into the process chamber is uniform even not by disposing any electromagnetic absorbing member at the peripheral portion of the radial waveguide. Since the microwave reflected from the peripheral portion of the radial waveguide can be used to produce a plasma if any electromagnetic absorbing member is not disposed, the plasma can be produced efficiently, and excessive heat is not generated.

10 Claims, 7 Drawing Sheets

RADIAL ANTENNA AND PLASMA PROCESSING APPARATUS COMPRISING THE SAME

BACKGROUND OF THE INVENTION

The present invention relates to a radial antenna and a plasma processing apparatus using the same.

In the manufacture of a semiconductor device, plasma processing apparatuses are used often to perform processes such as formation of an oxide film, crystal growth of a semiconductor layer, etching, and ashing. Among the plasma processing apparatuses, a microwave plasma processing apparatus is available which produces a high-density plasma by introducing a microwave into a process chamber through a radial antenna. According to the characteristic feature of the microwave plasma processing apparatus, it has wide applications because it can stably produce a plasma even if the pressure of the plasma gas is comparatively low.

Figure 7A:
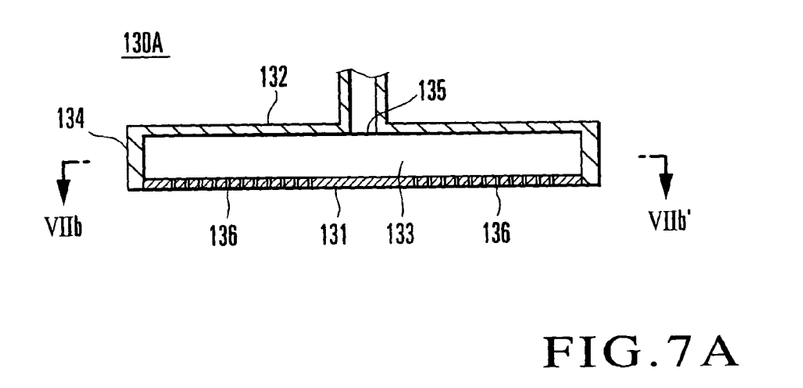
FIG. 7 includes views showing an example of a radial antenna conventionally used in a plasma processing apparatus.
Figure 7B:
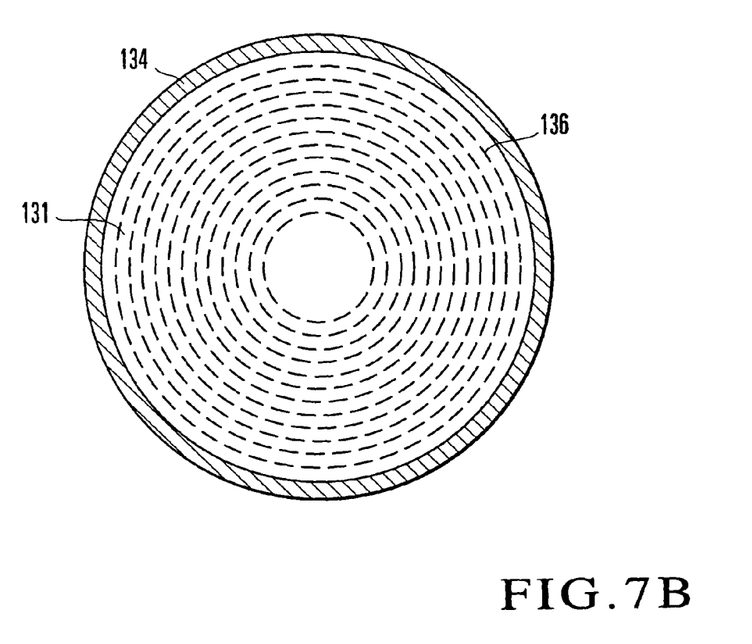

FIG. 7 includes views showing the arrangement of an example of a radial antenna conventionally used in the microwave plasma processing apparatus. FIG. 7(a) is a longitudinal sectional view of the radial antenna, and FIG. 7(b) is a cross-sectional view taken along the line VIIb-VIIb' of FIG. 7(a).

As shown in FIG. 7(a), a radial antenna 130A conventionally used in the plasma processing apparatus is formed of two parallel conductive plates 131 and 132 which form a radial waveguide 133, and a ring member 134 which connects the peripheral portions of the conductive plates 131 and 132. A microwave entrance 135 is formed at the center of the conductive plate 132 to introduce a microwave from a microwave generator (not shown). The conductive plate 131 has a large number of slots 136, as shown in FIG. 7(b), to radiate the microwaves propagating in the radial waveguide 133 to a process vessel (not shown). The ring member 134 is made of a conductor.

The microwaves introduced from the microwave entrance 135 are radiated little by little from the large number of slots 136 into the process chamber while the microwaves propagate radially from the center toward the peripheral portion of the radial waveguide 133. The microwaves that have reached the peripheral portion of the radial waveguide 133 are reflected by the ring member 134 to return toward the center of the radial waveguide 133. The microwaves are gradually radiated through the large number of slots 136 into the process chamber while the microwaves propagate between the center and peripheral portion of the radial waveguide 133, so the microwaves are utilized for producing the plasma.

While the microwaves reflect at the ring member 134 in the radial waveguide 133, standing waves of a plurality of modes are formed, so a complex electromagnetic mode is produced in the radial waveguide 133. Hence, radiation from the radial antenna 130A to the process chamber becomes nonuniform, and a homogeneous plasma cannot be produced.

Figure 8A:
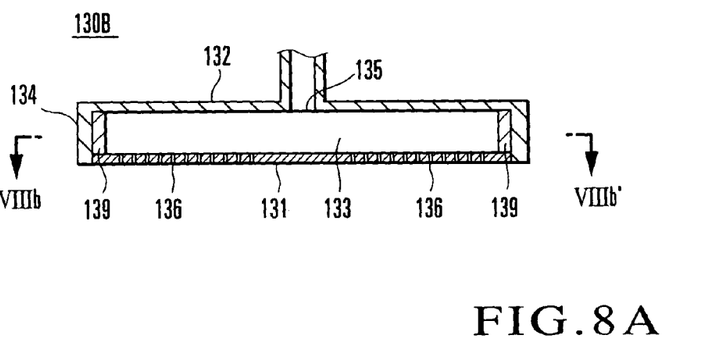
FIG. 8 includes views showing another example of the radial antenna conventionally used in the plasma processing apparatus.
Figure 8B:
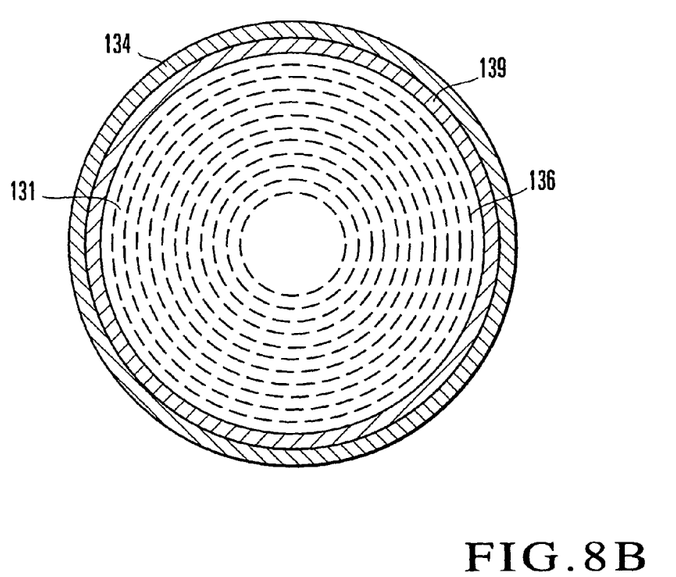

FIG. 8 includes views showing the arrangement of another example of the radial antenna conventionally used in the microwave plasma processing apparatus. FIG. 8(a) is a longitudinal sectional view, and FIG. 8(b) is a cross-sectional view taken along the line VIIIb-VIIIb'.

A radial antenna 130B shown in FIG. 8 is an improvement over the radial antenna 130A shown in FIG. 7, in which an electromagnetic absorbing member 139 made of a carbon-containing ceramic material or the like is applied to the inner wall of a ring member 134. The electromagnetic absorbing member 139 absorbs most of the microwaves that have reached the peripheral portion of a radial waveguide 133, so the microwaves are not substantially reflected toward the center of the radial waveguide 133. Accordingly, no complex electromagnetic mode is formed in the radial waveguide 133. Radiation toward the process chamber becomes uniform, so a homogeneous plasma can be produced.

With the conventional radial antenna 130B shown in FIG. 8, the microwaves absorbed by the peripheral portion of the radial waveguide 133 cannot be utilized for producing the plasma. The plasma production efficiency is thus poor. Since the electromagnetic absorbing member generates heat upon absorption of the microwaves, the peripheral portion of the radial waveguide 133, particularly the ring member 134, is locally heated to deform undesirably.

SUMMARY OF THE INVENTION

The present invention has been made to solve the above problems, and has as its object to improve the plasma uniformity without sacrificing the plasma production efficiency or generating extra heat.

In order to achieve the above object, a radial antenna according to the present invention is characterized in that it has a guide member in the direction of propagation of the microwave from the microwave introducing portion to the radiating portion.

More specifically, the radial antenna comprises a first conductive plate having a plurality of slots, a second conductive plate having a microwave entrance and arranged to oppose the first conductive plate, a ring member which connects peripheral portions of the first and second conductive plates, and a guide member arranged in a radial waveguide formed of the first and second conductive plates to extend in a direction of propagation of a microwave from the microwave entrance to the ring member.

The guide member can suppress generation of a standing wave at least in the circumferential direction of the radial waveguide, and can prevent production of complex electromagnetic mode due to a microwave reflected from the peripheral portion of the radial waveguide. Hence, no electromagnetic absorbing member need be provided to the peripheral portion of the radial waveguide. The microwaves reflected from the peripheral portion of the radial waveguide are also radiated through the slots formed in the first conductive plate, so the microwaves contribute to production of a plasma. Since no electromagnetic absorbing member need be provided, excessive heat is not generated.

In this radial antenna, the guide member may comprise a plurality of conductive partitions arranged in the radial waveguide radially when viewed from the top and extending between the first and second conductive plates.

A gap between adjacent ones of the partitions is preferably set to not less than a length corresponding to a substantial half-wave length of a microwave propagating in the radial waveguide. With this setting, the microwave can easily pass through a region sandwiched by the partitions.

A gap between adjacent ones of the partitions is preferably set to less than a length corresponding to substantial one wave length of the microwave. With this setting, standing waves of a plurality of modes do not mixedly exist in the region sandwiched by the partitions. Hence, no complex electromagnetic mode is produced in this region.

Each of the partitions may have a linear planar shape, or may have such a shape that a side thereof which is close to the ring member may be arcuate in the same direction as an inner periphery of the ring member.

The partitions are arranged radially, preferably to keep away from the slots formed in the first conductive plate. When the partitions are arranged in this manner, radiation through the respective slots will not be interfered with by the partitions.

The microwave entrance is preferably formed at a center of the second conductive plate. The microwave may be introduced to the microwave entrance by a coaxial line, or by a cylindrical waveguide.

A plasma processing apparatus according to the present invention is characterized by comprising a susceptor which places a target object thereon, a process chamber which accommodates the susceptor, exhaust means for evacuating an interior of the process chamber, gas supply means for supplying a gas into the process chamber, and antenna means which is arranged to oppose a surface of the susceptor where the target object is to be placed and which supplies a microwave into the process chamber, wherein the antenna means comprises the radial antenna described above.

DETAILED DESCRIPTION OF THE INVENTION

The embodiments of the present invention will be described in detail with reference to the accompanying drawing. A description will be made by way of examples in which a plasma processing apparatus using a radial antenna according to the present invention is applied to etching apparatuses.

First Embodiment

Figure 1:
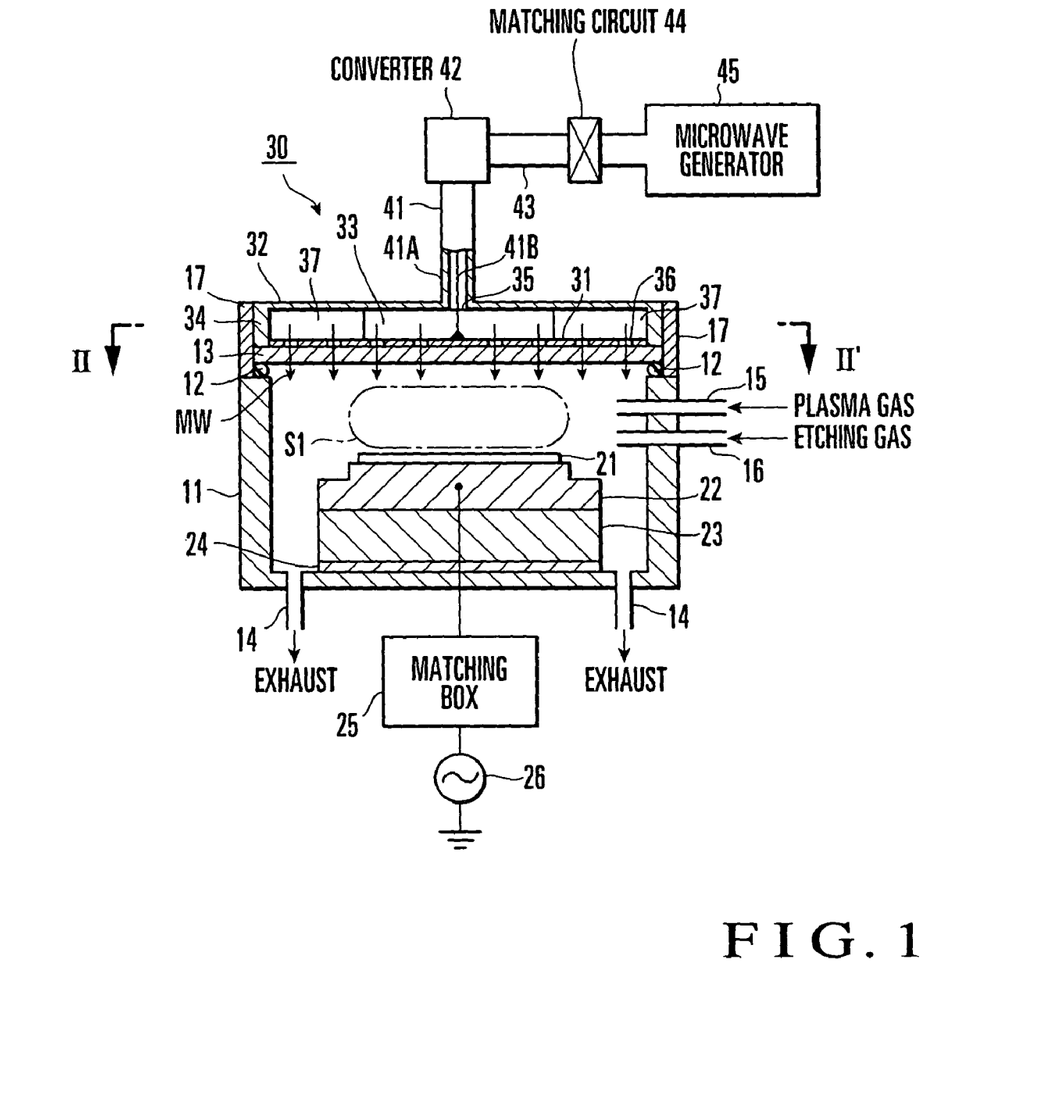
FIG. 1 is a view showing the arrangement of an etching apparatus according to the first embodiment of the present invention.

FIG. 1 is a view showing the arrangement of an etching apparatus according to the first embodiment of the present invention. In FIG. 1, the sectional structure of part of the arrangement is shown.

The etching apparatus shown in FIG. 1 has a cylindrical process chamber 11 with an upper opening. This process chamber 11 is made of a conductive material such as aluminum.

Exhaust ports (exhaust means) 14 communicating with a vacuum pump (not shown) are formed in the bottom of the process chamber 11, and can evacuate the interior of the process chamber 11 to a predetermined vacuum degree.

A plasma gas supply nozzle 15 for introducing a plasma gas such as Ar into the process chamber 11, and a process gas supply nozzle 16 for introducing an etching gas are formed in the upper and lower portions, respectively, of the side wall of the process chamber 11. The nozzles (gas supply means) 15 and 16 are formed of quartz pipe or the like.

A susceptor 22 for placing an etching target substrate (target object) on its upper surface is accommodated in the process chamber 11, and is fixed on a support table 23 which is fixed to the bottom of the process chamber 11 through an insulating plate 24. The susceptor 22 is also connected to a bias RF power supply 26 through a matching box 25.

A flat plate-like dielectric plate 13 is horizontally arranged in the upper opening of the process chamber 11. A quartz glass or ceramic (e.g., $Al_2O_3$ or AlN) plate with a thickness of about 20 mm to 32 mm is used as the dielectric plate 13. A seal member 12 such as an O-ring is disposed at the bonding portion of the process chamber 11 and dielectric plate 13. This assures the hermeticity in the process chamber 11.

A radial antenna 30 is disposed on the dielectric plate 13 with its radiating portion (conductive plate 31 to be described later) facing down. The radial antenna 30 is an antenna means that supplies microwaves MW into the process chamber 11 through the dielectric plate 13. The dielectric plate 13 is arranged to oppose the radiating portion of the radial antenna 30, and covers the radiating portion entirely. Hence, the radial antenna 30 is protected from the plasma produced in the process chamber 11. The circumferential surfaces of the dielectric plate 13 and radial antenna 30 are covered by a shield material 17.

The radial antenna 30 is formed of the first conductive plate 31 which forms the radiating portion, a second conductive plate 32 arranged above the conductive plate 31 to oppose it, a ring member 34 for connecting the peripheral portions of the conductive plates 31 and 32, and a plurality of partitions 37 arranged in a radial waveguide 33 formed of the two conductive plates 31 and 32. The radial antenna 30 with this arrangement has a cylindrical shape with the plurality of partitions 37 being arranged in it. The conductive plates 31 and 32, ring member 34, and partitions 37 are made of a conductor such as copper or aluminum. No electromagnetic absorbing member is attached to the inner wall of the ring member 34, unlike in the conventional radial antenna 130B shown in FIG. 8.

A microwave entrance 35 as the introducing portion of the microwave MW is formed at the center of the conductive plate 32. The conductive plate 31 which forms the radiating portion has a large number of slots 36.

A coaxial line 41 is connected to the center of the radial antenna 30. An outer conductor 41A of the coaxial line 41 is connected to the microwave entrance 35 of the conductive plate 32. The distal end of a central conductor 41B of the coaxial line 41 has a circular conical shape, the bottom of which is connected to the center of the conductive plate 31.

The coaxial line 41 connected to the radial antenna 30 in this manner is connected to a microwave generator 45 through a rectangular coaxial converter 42 and rectangular waveguide 43. For example, the microwave generator 45 generates a microwave MW of 2.45 GHz. The frequency of the microwave MW suffices as far as it falls within the range of 1 GHz to 10-odd GHz. A matching circuit 44 for impedance matching is provided midway along the rectangular waveguide 43, so the power use efficiency can be improved.

Alternatively, the microwave generator 45 and the microwave entrance 35 of the radial antenna 30 may be connected by a cylindrical waveguide.

Figure 2:
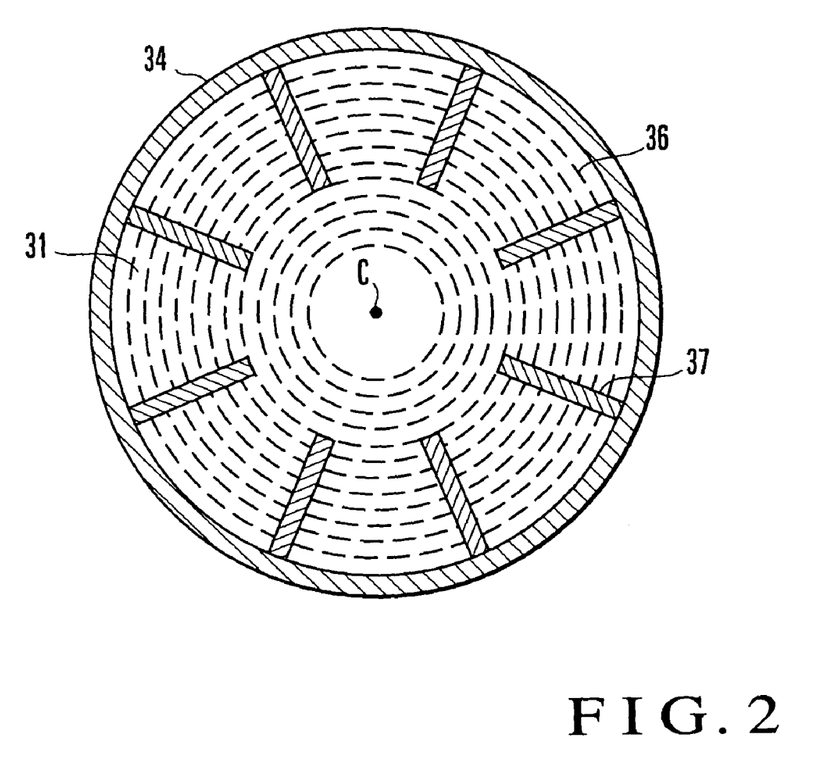
FIG. 2 is a sectional view showing an arrangement of a radial antenna.

FIG. 2 is a sectional view of the radial antenna 30, and shows a section taken along the line II-II' of FIG. 1. The slots 36 formed in the conductive plate 31 are concentrically formed in a large number, as shown in FIG. 2. The pitch among the slots 36 in the radial direction is set on the basis of a wavelength λg of the microwave MW in the radial waveguide 33. To realize a so-called radial antenna, the pitch is set to almost a length corresponding to λg. To realize a so-called leaky-wave antenna, the pitch is set to almost a length corresponding to λg/20 to λg/30.

The eight partitions 37 are formed in that region of the radial waveguide 33 which is close to the peripheral portion, to keep away from the slots 36. Each partition 37 is arranged in the direction of propagation, from the microwave entrance 35 to the ring member 34, of the microwave MW. More specifically, the respective partitions 37 have a linear planar shape when viewed from the top, and are equiangularly distributed radially with respect to a center C of the radial waveguide 33. One end of each partition 37 is connected to the ring member 34. These partitions 37 extend between the conductive plates 31 and 32 to have the same heights as that of the ring member 34, as shown in FIG. 1, and divide that region of the radial waveguide 33 which is close to its peripheral portion into eight, as shown in FIG. 2. As described above, the partitions 37 are arranged to keep away from the slots 36, so an electric field as designed can be radiated through the slots 36.

The thickness of each partition 37 is about 1 mm to 3 mm. The inner and outer peripheral portions of each partition 37 shown in FIG. 2 have the same thickness, but they may be different. For example, the outer peripheral portion may be formed thicker than the inner peripheral portion.

The ring member 34 shown in FIG. 2 has a circular shape. Alternatively, those portions of the ring member 34 which are between the adjacent partitions 37 may be linearly formed, so the entire ring member 34 forms a polygonal shape.

Figure 3:
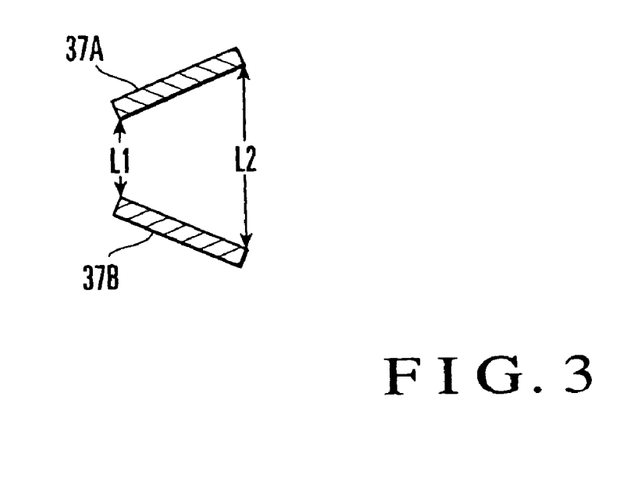
FIG. 3 is a view for explaining how to set the gap between the adjacent partitions in FIG. 2.

FIG. 3 is a view for explaining how to set the gap between the adjacent partitions 37. Since the microwave entrance 35 is formed at the center of the conductive plate 32, the gap between adjacent partitions 37A and 37B is defined as a distance between the surfaces of the partitions 37A and 37B in a direction perpendicular to the direction of propagation of the microwave MW in the radial waveguide 33. In this case, the gap between the adjacent partitions 37A and 37B is preferably set to almost satisfy L1≧λg/2 and L2≧λg. If L1 becomes less than λg/2, the microwave MW becomes difficult to pass. If L2 is less than λg, standing waves of the plurality of modes can be prevented from being mixedly present in the region sandwiched by the partitions 37A and 37B.

A delay member (not shown) made of a dielectric material with a relative dielectric constant of larger than 1, e.g., a ceramic material, may be arranged in the radial waveguide 33.

The operation of the etching apparatus shown in FIG. 1 will be described.

With the substrate 21 being placed on the upper surface of the susceptor 22, the interior of the process chamber 11 is set to a vacuum degree of, e.g., about 0.01 Pa to 10 Pa. While maintaining this vacuum degree, Ar is supplied as the plasma gas from the plasma gas supply nozzle 15, and an etching gas such as $CF_4$ is supplied from the process gas supply nozzle 16 under flow rate control.

With the plasma gas and etching gas being supplied into the process chamber 11, the microwave MW from the microwave generator 45 is supplied to the radial antenna 30 through the rectangular waveguide 43, rectangular coaxial converter 42, and coaxial line 41.

The microwave MW supplied to the radial antenna 30 spreads radially from the center in the radial waveguide 33 formed of the conductive plates 31 and 32. The partitions 37 arranged in that region of the radial waveguide 33 which is close to its peripheral portion serve as the guide members, so the microwaves MW propagate along the partitions 37. Since the gap between the adjacent partitions 37 is set to almost L1≧λg/2, the microwave MW can easily propagate in the region partitioned by the partitions 37.

Since no electromagnetic absorbing member like the conventional one shown in FIG. 8 is attached to that inner wall of the ring member 34 which serves as the peripheral portion of the radial waveguide 33, the microwaves MW that have reached the peripheral portion of the radial waveguide 33 are totally reflected there and are directed toward the center of the radial waveguide 33 along the partitions 37. The microwaves MW are radiated little by little through the large number of slots 36 while propagating between the center and peripheral portion of the radial waveguide 33. Therefore, in the radial antenna 30, not only the microwaves MW directed from the center toward the peripheral portion of the radial waveguide 33 but also the microwaves reflected from the peripheral portion are radiated through the slots 36.

The microwaves MW radiated from the radial antenna 30 are transmitted through the dielectric plate 13 and are introduced into the process chamber 11. The microwaves MW form an electric field in the process chamber 11 to ionize Ar, thus producing a plasma in a space S1 above the substrate 11 as the processing target.

In this etching apparatus, since the susceptor 22 is biased with a negative potential, ions are extracted from the produced plasma to etch a substrate 21.

In this radial antenna 30, the microwaves MW reflected from the peripheral portion of the radial waveguide 33 are also radiated through the slots 36, as described above. As the microwaves MW reflected from the peripheral portion can also be utilized to produce the plasma, the plasma can be efficiently produced in the same manner as in the prior art shown in FIG. 7.

In that region in the radial waveguide 33 which is divided by the partitions 37, the microwaves MW directed toward the peripheral portion of the radial waveguide 33 and the microwaves MW reflected and directed toward the center form a standing wave. Since the gap between the adjacent partitions 37 is set to almost L2<λg, standing waves with a plurality of modes are not mixedly present in this region. Hence, a complex electromagnetic mode is not produced in this region. Therefore, as this radial antenna 30 can perform uniform radiation in the same manner as in the prior art shown in FIG. 8, it can produce a uniform plasma.

In this radial antenna 30, since no electromagnetic absorbing member is attached to the inner wall of the ring member 34, as described above, the ring member 34 will not be heated to deform.

In this manner, when the radial antenna 30 is used, the plasma uniformity can be improved without sacrificing the plasma production efficiency or generating extra heat.

Figure 4:
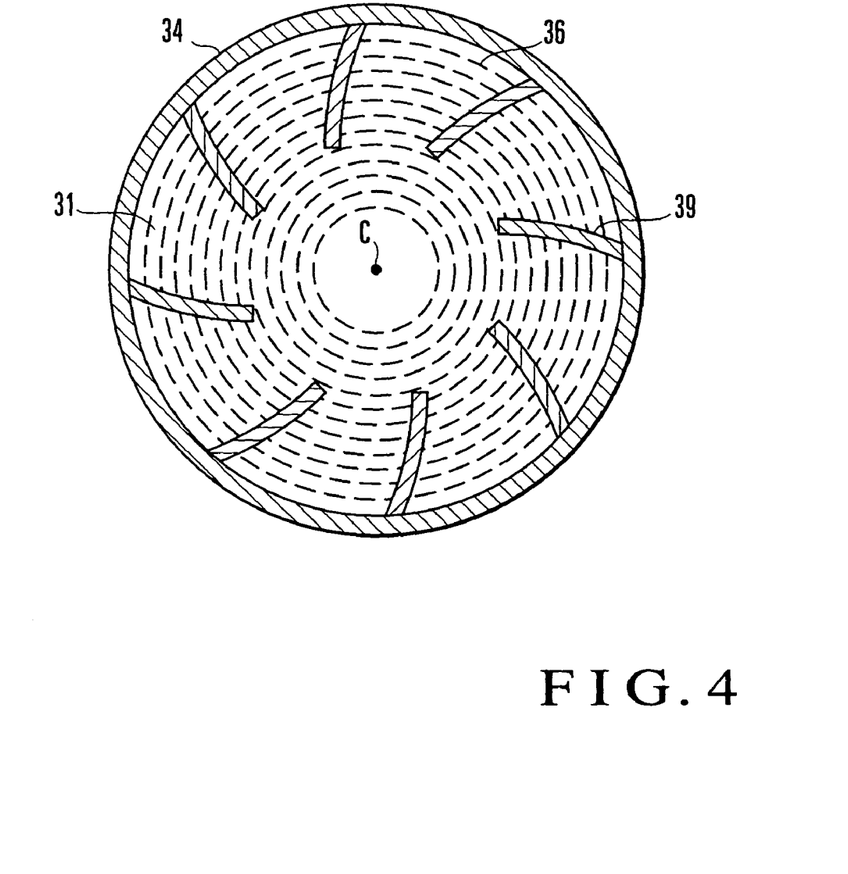
FIG. 4 is a sectional view showing a modification of the partitions.

In FIG. 2, the partitions 37 with the linear planar shape when viewed from the top are arranged radially. Alternatively, as shown in FIG. 4, partition plates 39 with such planar shapes that their sides close to the ring member 34 are arcuate in the same direction as their inner peripheral portions may be arranged radially.

In this embodiment, the eight partitions 37 are arranged radially. The number of partitions 37 is not limited to eight, but suffices as far as it is approximately a number obtained by dividing the inner circumferential length of the ring member 34 by λg.

Second Embodiment

Figure 5:
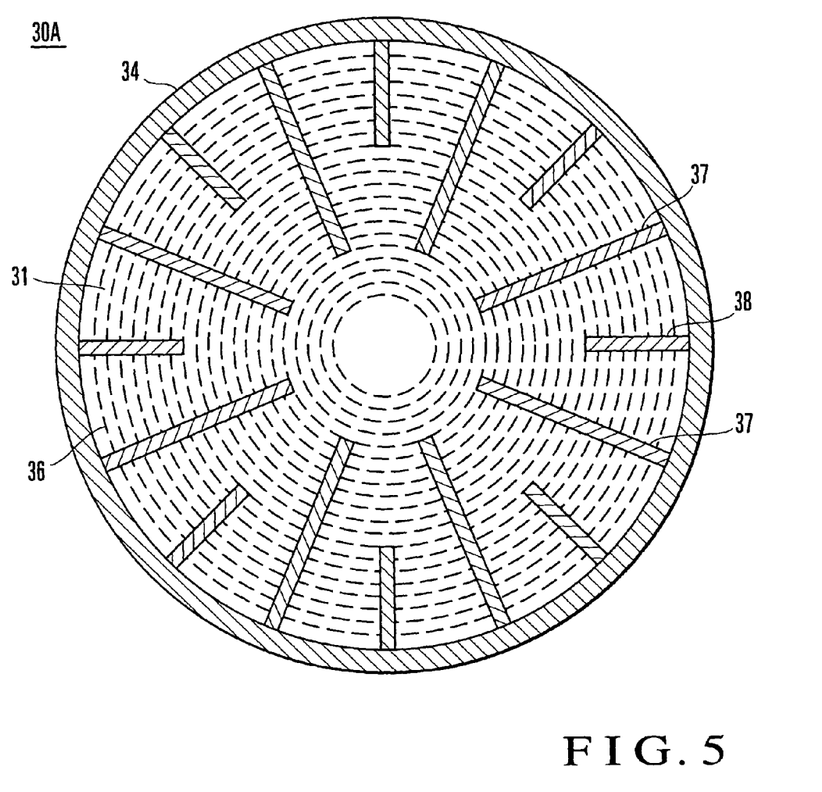
FIG. 5 is a sectional view showing another arrangement of the radial antenna.
Figure 6:
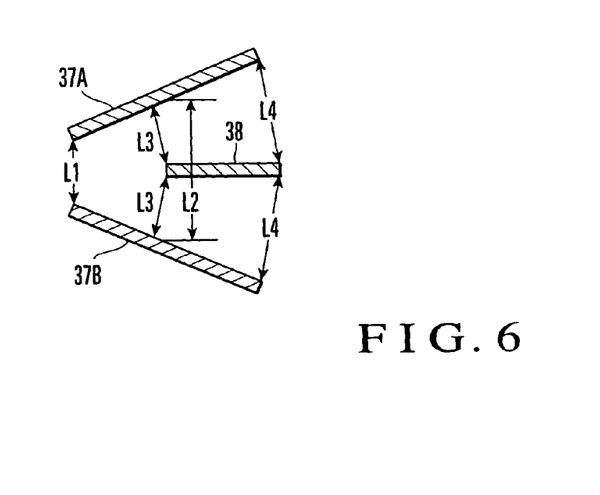
FIG. 6 is a view for explaining how to set the gap between the adjacent partitions in FIG. 5.

FIG. 5 is a sectional view showing an arrangement of a radial antenna with an open area larger than that of the radial antenna 30 shown in FIGS. 1 and 2, and shows a section corresponding to FIG. 2. FIG. 6 is a view for explaining how to set the gap between adjacent partitions. In FIGS. 5 and 6, the same portions as in FIGS. 2 and 3 are denoted by the same reference numerals, and a description thereof will be omitted as required.

When a radial antenna 30A with a large open area is to be formed, a gap L2 between adjacent partitions 37A and 37B sometimes satisfies L2≧λg, as shown in FIG. 6. In this case, another partition 38 may be arranged at part of the region where the gap L2 of the partitions 37A and 37B satisfies L2≧λg. At this time, the gaps among the partitions 37A and 37B, and 38 are set to approximately satisfy L3≧λg/2 and L4<λg.

When a radial antenna with a much larger open area is to be formed, other partitions may be arranged one after another among adjacent partitions in accordance with the conditions described above.

Then, a uniform plasma can be efficiently produced in the same manner as in the radial antenna 30 shown in FIGS. 1 and 2, and thermal deformation of a ring member 34 can be prevented.

In the above description, a plasma processing apparatus using a radial antenna according to the present invention is applied to etching apparatuses. The present invention can also naturally be applied to other plasma processing apparatuses such as a plasma CVD apparatus.

Third Embodiment

Figure 9:
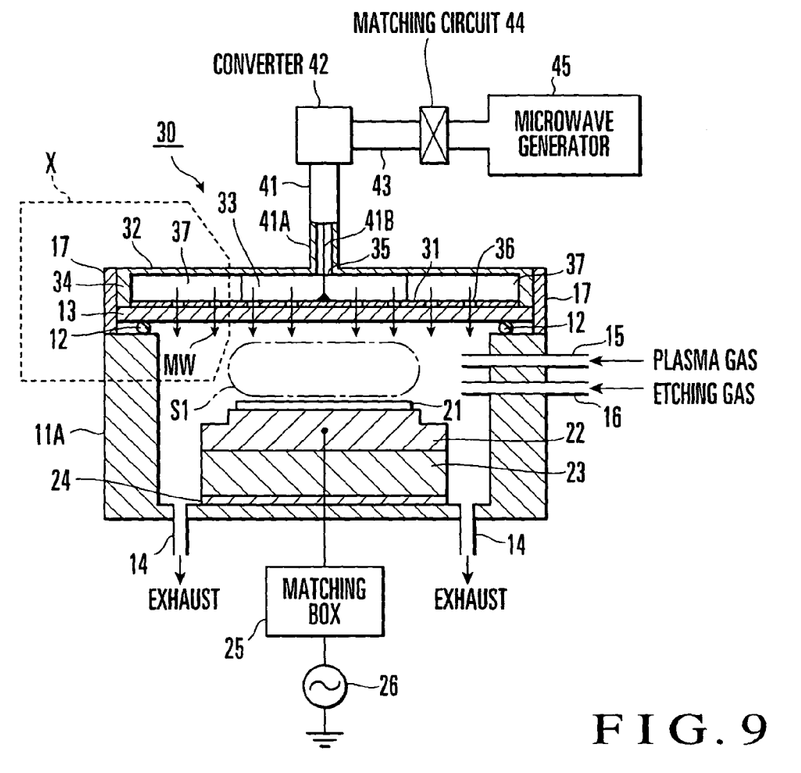
FIG. 9 is a view showing the arrangement of an etching apparatus according to the third embodiment of the present invention.
Figure 10:
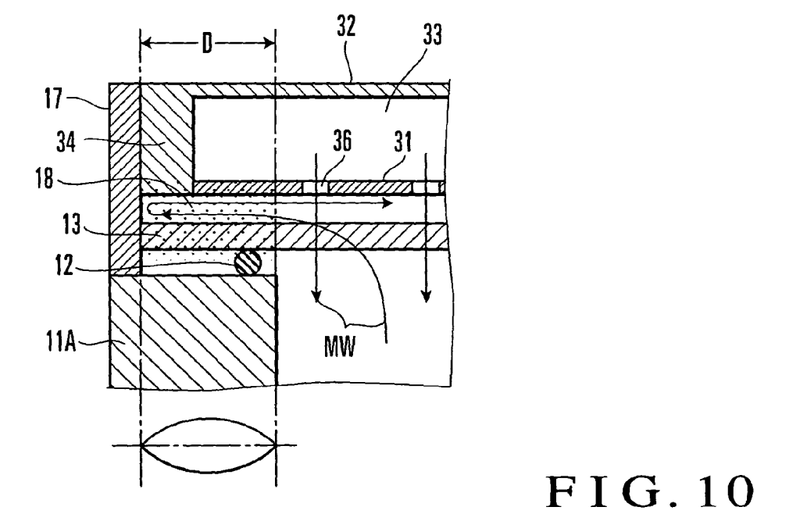
FIG. 10 is an enlarged sectional view showing the portion surrounded by a broken line in FIG. 9.

FIG. 9 is a view showing the arrangement of an etching apparatus according to the third embodiment of the present invention. In FIG. 9, the same portions as in FIG. 1 are denoted by the same reference numerals, and a description thereof will be omitted as required. FIG. 10 is an enlarged sectional view showing a portion X surrounded by a broken line in FIG. 9. For the sake of descriptive convenience, the gap between a dielectric plate 13 and radial antenna 30 is exaggerated.

In the etching apparatus shown in FIG. 9, a distance D from the inner surface of a ring-like shield material 17 to the inner surface of the side wall of a process chamber 11A is set to a length corresponding to almost N/2 times (N is a natural number) a wavelength λg of a microwave MW in a space (a satin finish region in FIG. 10 which includes the dielectric plate 13) 18 which is formed between the upper surface of the side wall of the process chamber 11A and the radial antenna 30. The position to arrange the shield material 17 is determined by considering the relative dielectric constant of a member that forms the space 18, e.g., the dielectric plate 13.

A ring-like seal member 12 which is present at the bonding portion of the upper surface of the side wall of the process chamber 11A and the dielectric plate 13 and hermetically seals the bonding portion is arranged in the vicinity of a position which is away from the inner surface of the shield material 17 by a length corresponding to M×λg/2 (M is a natural number of N or less). At this time, it suffices if the seal member 12 is arranged at a position which avoids a position of approximately (2M+1)λg/4 from the inner surface of the shield material 17. The seal member 12 is preferably arranged at a position of M×λg/2 times. The position to arrange the seal member 12 is also determined by considering the relative dielectric constant of the member that forms the space 18.

Of the microwaves MW introduced from the radial antenna 30 into the process chamber 11A through the dielectric plate 13, some do not contribute to plasma production but repeat irregular reflection in the process chamber 11A. Some of such microwaves MW enter the space 18 formed between the upper surface of the side wall of the process chamber 11A and the radial antenna 30. The microwaves MW that have entered the space 18 are reflected by the shield material 17. Hence, a standing wave as shown in FIG. 10 is formed in the space 18.

In the conventional etching apparatus, since the distance D is arbitrarily set, it is sometimes approximately λg/4, or 3λg/4. In this case, the position of the inner surface of the side wall of the process chamber corresponds to the antinode of the standing wave formed in the space 18, so the potential at the inner surface of the side wall of the process chamber increases, sometimes causing abnormal discharge at this position.

This abnormal discharge damages the side wall of the process chamber. Fine dust generated upon this damage contaminates the interior of the process chamber.

If a seal member such as an O-ring is arranged at a position which is away from the inner surface of the shield member by approximately λg/4 or 3λg/4, the strong electromagnetic field of the standing wave damages the seal member to shorten its service life.

In the etching apparatus shown in FIG. 9, since the distance D is set to approximately N×λg/2, the position of the inner surface of the side wall of the process chamber 11A corresponds to the node of standing wave formed in the space 18. Hence, the potential at the inner surface of the side wall of the process chamber 11A becomes zero, so no abnormal discharge occurs at this position. Therefore, contamination in the process chamber 11A by abnormal discharge can be suppressed.

The seal member 12 is arranged in the vicinity of a position away from the inner surface of the shield material 17 by M×λg/2. As the electromagnetic field at this position is weak, damage to the seal member 12 by the electromagnetic field can be suppressed, so the service life of the seal member 12 can be prolonged.

In this embodiment, the description has been made by way of examples in which a plasma processing apparatus according to the present invention is applied to etching apparatuses. The present invention can also naturally be applied to other plasma processing apparatuses such as a plasma CVD apparatus. The present invention can be applied not only to a microwave plasma processing apparatus but also to, e.g., an ECR (Electron Cyclotron Resonance) plasma processing apparatus.

The invention claimed is:

1. A radial antenna characterized by comprising
a first conductive plate having a plurality of slots,
a second conductive plate having a microwave entrance and arranged to oppose said first conductive plate,
a ring member which connects peripheral portions of said first and second conductive plates, and
a guide member arranged in a radial waveguide formed of said first and second conductive plates to extend in a direction of propagation of a microwave from said microwave entrance to said ring member.

2. A radial antenna according to claim 1, characterized in that said guide member comprises a plurality of conductive partitions arranged in the radial waveguide radially when viewed from the top and extending between said first and second conductive plates.

3. A radial antenna according to claim 2, characterized in that a gap between adjacent ones of the partitions is not less than a length corresponding to a substantial half-wave length of a microwave propagating in the radial waveguide.

4. A radial antenna according to claim 2, characterized in that a gap between adjacent ones of the partitions is less than a length corresponding to substantial one wave length of the microwave.

5. A radial antenna according to claim 2, characterized in that each of the partitions has a linear planar shape.

6. A radial antenna according to claim 2, characterized in that each of the partitions has such a shape that a side thereof which is close to said ring member is arcuate in the same direction as an inner periphery of said ring member.

7. A radial antenna according to claim 2, characterized in that the partitions are arranged to keep away from the slots.

8. A radial antenna according to claim 1, characterized in that the microwave entrance is formed at a center of said second conductive plate.

9. A plasma processing apparatus characterized by comprising a susceptor which places a target object thereon, a process chamber which accommodates said susceptor, exhaust means for evacuating an interior of said process chamber, gas supply means for supplying a gas into said process chamber, and antenna means which is arranged to oppose a surface of said susceptor where the target object is to be placed and which supplies a microwave into said process chamber, wherein said antenna means comprises the radial antenna according to claim 1.

10. A radial antenna characterized in that a guide member is formed to suppress a formation of standing waves within said radial antenna.

* * * * *